US012727167B2

(12) United States Patent
van der Straten et al.

(10) Patent No.: US 12,727,167 B2
(45) Date of Patent: Sep. 1, 2026

(54) DIELECTRIC ISOLATION FOR MRAM ARRAY

(71) Applicant: International Business Machines Corporation, Armonk, NY (US)

(72) Inventors: Oscar van der Straten, Guilderland Center, NY (US); Koichi Motoyama, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 421 days.

(21) Appl. No.: 18/355,813

(22) Filed: Jul. 20, 2023

(65) Prior Publication Data

US 2025/0031382 A1 Jan. 23, 2025

(51) Int. Cl.

*H10N 50/10* (2023.01)
*H10B 61/00* (2023.01)
*H10N 50/01* (2023.01)
*H10N 50/20* (2023.01)
*H10N 50/80* (2023.01)

(52) U.S. Cl.

CPC ............. *H10B 61/00* (2023.02); *H10N 50/01* (2023.02); *H10N 50/10* (2023.02); *H10N 50/20* (2023.02); *H10N 50/80* (2023.02)

(58) Field of Classification Search

CPC ........ H10B 61/00; H10N 50/01; H10N 50/20; H10N 50/80; H10N 50/10

See application file for complete search history.

(56) References Cited

U.S. PATENT DOCUMENTS

| | | | | |
|---|---|---|---|---|
| 8,455,965 | B2 | 6/2013 | Li et al. | |
| 8,644,063 | B2 | 2/2014 | Li et al. | |
| 9,570,670 | B2 * | 2/2017 | Park | H10N 50/10 |
| 10,010,924 | B2 * | 7/2018 | Moriya | B21D 28/34 |
| 10,032,981 | B2 | 7/2018 | Han et al. | |
| 10,700,264 | B2 | 6/2020 | Liao et al. | |
| 10,727,272 | B2 | 7/2020 | Chuang et al. | |
| 11,114,606 | B2 | 9/2021 | Reznicek et al. | |
| 11,133,457 | B2 | 9/2021 | Patlolla et al. | |
| 12,382,840 | B2 * | 8/2025 | Motoyama | H10N 50/10 |
| 2015/0056722 | A1 | 2/2015 | Li et al. | |
| 2021/0098685 | A1 * | 4/2021 | Liou | H10N 50/80 |
| 2024/0188448 | A1 * | 6/2024 | van der Straten | H10N 50/01 |
| 2025/0107452 | A1 * | 3/2025 | van der Straten | H10N 50/85 |

* cited by examiner

*Primary Examiner* — David Vu
*Assistant Examiner* — Brandon C Fox
(74) *Attorney, Agent, or Firm* — Harrity & Harrity, LLP

(57) ABSTRACT

A magnetoresistive random access memory (MRAM) includes a pillar structure having a bottom electrode, a magnetic tunnel junction (MTJ) and a top electrode disposed on the MTJ. The MTJ has a reference layer, a free layer and a tunnel barrier disposed between the reference layer and the free layer. The MTJ is disposed on the bottom electrode. The bottom electrode and the top electrode are recessed within a periphery of the MTJ to form a disrupted sidewall profile.

19 Claims, 10 Drawing Sheets

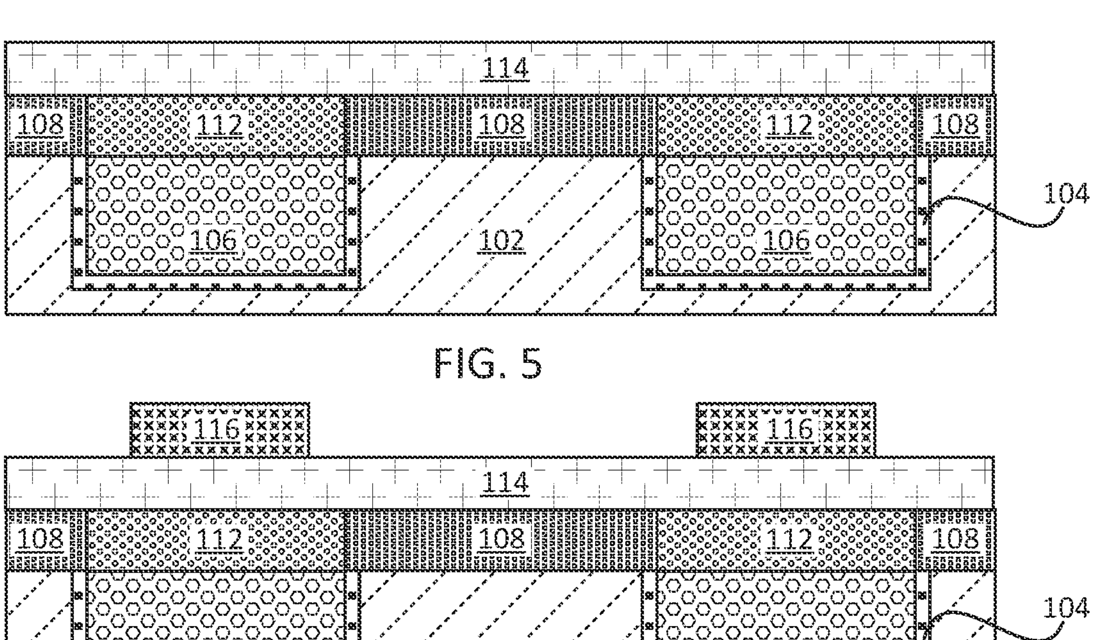
FIG. 5
FIG. 6
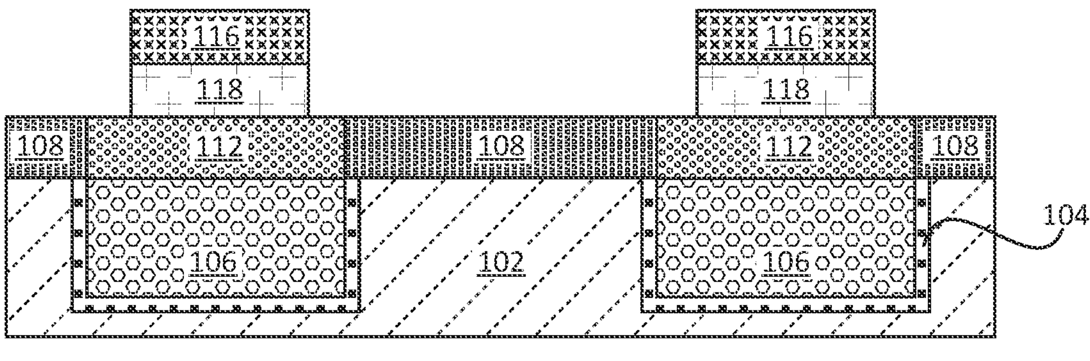
FIG. 7
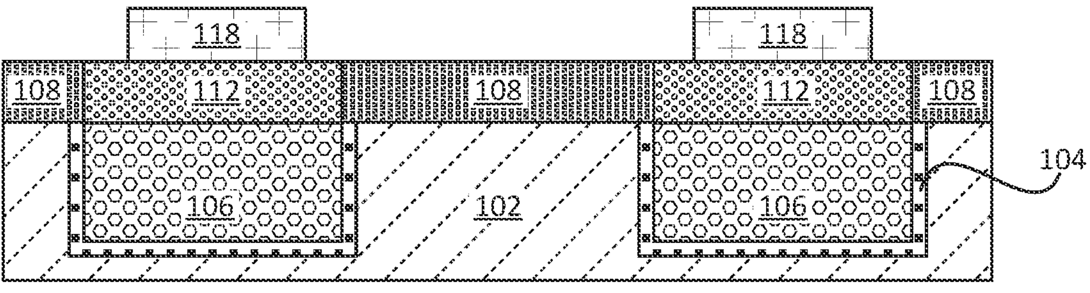
FIG. 8

120
118
120
118
120
108
112
108
112
108
104
106
102
106

122
120
118
120
118
120
108
112
108
112
108
104
106
102
106

124
124
122
120
118
120
118
120
108
112
108
112
108
104
106
102
106

124
124
126′
126′
120
118
120
118
120
108
112
108
112
108
104
106
102
106

126'
120
118
108
112
106
102
104

128

130

132

134
130
132
126'
132
126'
132
118
118
108
112
108
112
108
104
106
102
106

136
134
136
130

138

138
138
130

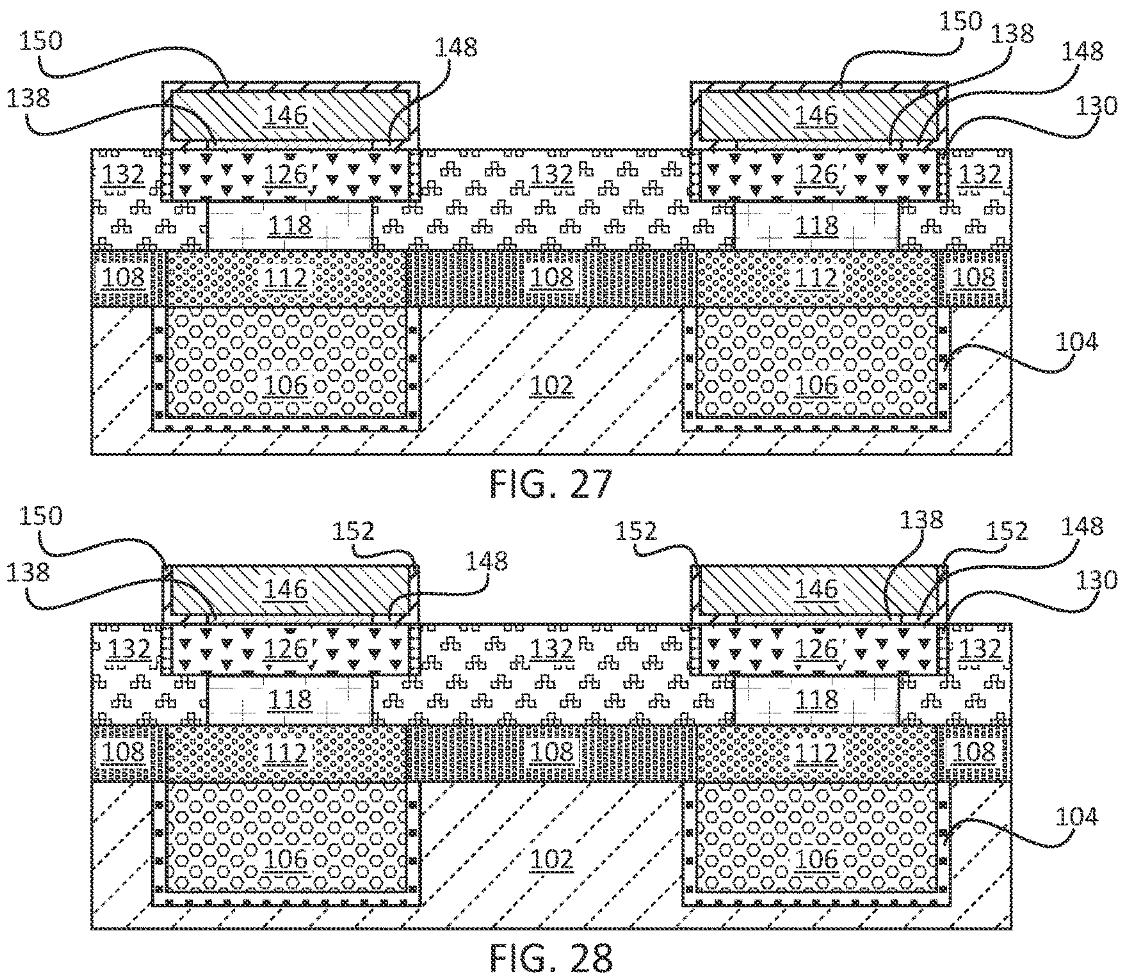
FIG. 27
FIG. 28
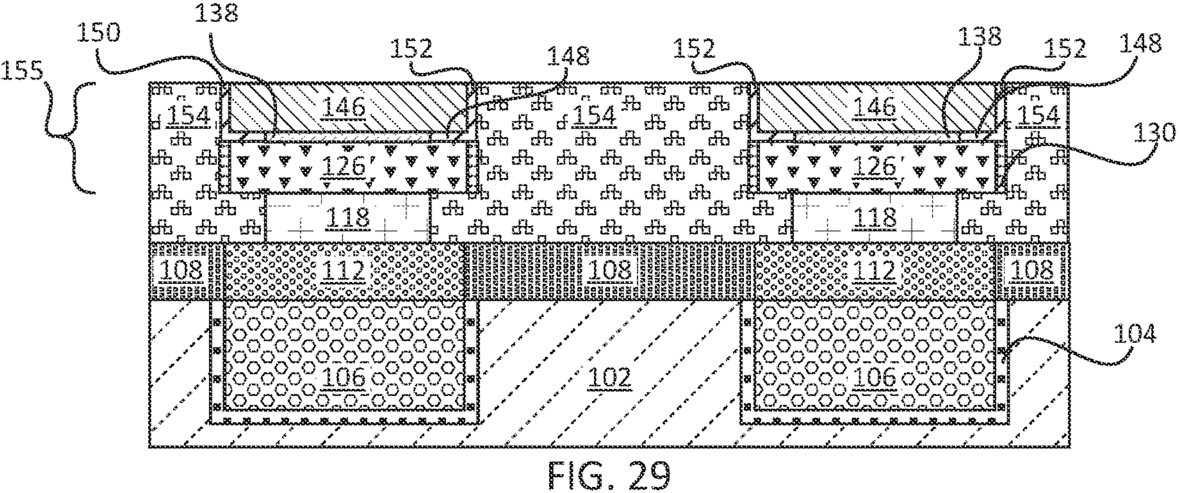
FIG. 29

DIELECTRIC ISOLATION FOR MRAM ARRAY

BACKGROUND

The present invention generally relates to magnetic memory devices, and more particularly to a magnetic memory device having a recessed sidewall profile that improves dielectric isolation.

For high performance magnetoresistive random access memory (MRAM) devices based on perpendicular magnetic tunnel junction (MTJ) structures, well-defined interfaces and interface control are important factors. MTJ structures may include a Co-based synthetic anti-ferromagnet (SAF), a CoFeB-based reference layer, a MgO-based tunnel barrier, a CoFeB-based free layer, and cap layers containing, e.g., Ta and/or Ru. Embedded MTJ structures are usually formed by subtractive patterning of blanket MTJ stacks into pillars between two metal levels. After MTJ stack patterning, inter-pillar spaces are filled with an interlevel dielectric (ILD) to enable connection to back-end-of-line (BEOL) wiring by a top contact level. ILD gapfill between inter-pillar spaces presents a significant challenge since the presence of voids in the ILD between the pillars can lead to shorts.

SUMMARY

In accordance with an embodiment of the present invention, a magnetoresistive random access memory (MRAM) includes a pillar structure having a bottom electrode, a magnetic tunnel junction (MTJ) and a top electrode disposed on the MTJ. The MTJ has a reference layer, a free layer and a tunnel barrier disposed between the reference layer and the free layer. The MTJ is disposed on the bottom electrode. The bottom electrode and the top electrode are recessed within a periphery of the MTJ to form a disrupted sidewall profile.

In accordance with an embodiment of the present invention, a method for making a MRAM includes forming a bottom electrode having a first footprint, forming a first sublayer of an interlevel dielectric layer corresponding to a level of the bottom electrode, forming a first ferromagnetic layer on the bottom electrode having a second footprint that is larger than the first footprint, forming a second sublayer of the interlevel dielectric layer corresponding to a level of the first ferromagnetic layer and forming a tunnel barrier on the first ferromagnetic layer within the first footprint. A dielectric ring is formed in a plane of the tunnel barrier and extends between the first footprint and the second footprint. A second ferromagnetic layer is formed on the tunnel barrier and the dielectric ring, and the second ferromagnetic layer is within the second footprint. A third sublayer of the interlevel dielectric layer corresponding to a level of the second ferromagnetic layer is formed, and a top electrode having the first footprint is formed.

In accordance with an embodiment of the present invention, a method for making a MRAM includes forming a bottom electrode having a first footprint; forming a first sublayer of an interlevel dielectric layer corresponding to a level of the bottom electrode; forming a first ferromagnetic layer on the bottom electrode having a second footprint that is larger than the first footprint; forming a first portion of a sidewall spacer on sidewalls of the first ferromagnetic layer; forming a second sublayer of the interlevel dielectric layer corresponding to a level of the first ferromagnetic layer; forming a tunnel barrier on the first ferromagnetic layer within the first footprint; forming a dielectric ring in a plane of the tunnel barrier and extending between the first footprint and the second footprint; forming a second ferromagnetic layer on the tunnel barrier and dielectric ring, the second ferromagnetic layer having the second footprint; forming a second portion of a sidewall spacer on sidewalls of the second ferromagnetic layer, wherein the first portion of the sidewall spacer and the second portion of the sidewall spacer intersect at the dielectric ring; forming a third sublayer of the interlevel dielectric layer corresponding to a level of the second ferromagnetic layer; forming a top electrode having the first footprint; and forming a fourth sublayer of the interlevel dielectric layer corresponding to a level of the top electrode.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 5 is a cross-sectional view showing a conductive layer deposited to form a bottom electrode in accordance with an embodiment of the present invention;

FIG. 6 is a cross-sectional view showing a hard mask formed to pattern a bottom electrode in accordance with an embodiment of the present invention;

FIG. 7 is a cross-sectional view showing the bottom electrode etched in accordance with an embodiment of the present invention;

FIG. 8 is a cross-sectional view showing the hard mask removed in accordance with an embodiment of the present invention;

FIG. 27 is a cross-sectional view showing an encapsulation dielectric layer formed over the free layer in accordance with an embodiment of the present invention;

FIG. 28 is a cross-sectional view showing an etch-back to form dielectric sidewalls on sides of the free layer in accordance with an embodiment of the present invention;

FIG. 29 is a cross-sectional view showing a dielectric layer formed in a third stage with a low aspect ratio in accordance with an embodiment of the present invention;

DETAILED DESCRIPTION

Figure 1:
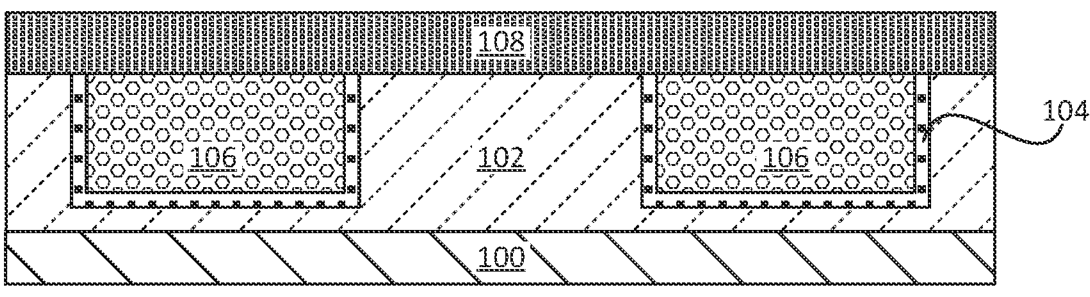
FIG. 1 is a cross-sectional view showing a cap dielectric layer formed on a conductor in accordance with an embodiment of the present invention.

Embodiments of the present invention include magnetic devices having recessed sidewall profile features that improve dielectric isolation between structures to reduce or eliminate shorts between magnetic devices. In one embodiment, the magnetic device includes a magnetoresistive random-access memory (MRAM) device. The MRAM device or cell can include a vertical construction that has a stack or pillar of conductive features. The stack or pillar includes a magnetic tunnel junction (MTJ), a top electrode and a bottom electrode.

In conventional systems, during interlevel dielectric fill between pillars, gaps may form as a result of incompletely filling in the regions adjacent to the pillars. In some instances conductive material can find its way into or along these gaps. Such conductive material can result in shorts between structures within each pillar.

In accordance with embodiments of the present invention, the risk of ILD gaps between pillars or pillar structures is reduced. In addition, the pillar structures are constructed to improve isolation between the pillar structures by employing sidewalls structures and recessed sidewall features. In one embodiment, the top electrode and the bottom electrode are recessed. In another embodiment, a tunnel barrier between magnetic layers (e.g., reference layer and free layer) of the MTJ stack is recessed, and the recess is filled with a different dielectric material. The tunnel barrier recess forms a dielectric ring around the tunnel barrier. The tunnel barrier can include a footprint that corresponds with the size and shape of the recessed top and bottom electrodes. The tunnel barrier can also have a narrower width than the reference layer, and have a narrower width than the free layer. In particularly useful embodiments of the present invention, the dielectric ring around the tunnel barrier can include, e.g., $Al_2O_3$ or $Ta_2O_5$.

In one embodiment, different dielectric encapsulation materials can be employed for the reference layer and the free layer. In one embodiment, SiNC can be employed for the dielectric encapsulation of the reference layer, while SiN can be employed for the dielectric encapsulation of the free layer. In another embodiment, the same dielectric encapsulation materials can be employed for both the reference layer and the free layer (e.g., SiN).

The features in accordance with embodiments of the present invention exhibit no ILD voids between pillar structures since only low aspect ratio features are filled with ILD. By employing a stepped buildup of ILD material at select stages of the fabrication process, ILD material is assured to avoid gaps or inconsistencies in the ILD fill. With little or no chance of voids, there is little or no chance that these voids would fill up with conductive material from top electrode or other formation processes. Instead, a highly consistent composite ILD layer is formed that completely isolates adjacent MRAM pillar structures or other structures in the device. Embodiments having ILD materials can include $SiO_2$-based and SiCOH-based dielectrics, although other materials and combinations of materials can be employed.

With the recessed sidewall profile and improved ILD gapfill, the scalability of MRAM or other memory elements can be extended due to void-free ILD gapfill between devices. In other words, more densely packed devices and higher reliability can be realized. Embedded MRAM performance is also improved due to a great reduction in the possibility of top contact shorts.

Exemplary applications/uses to which the present invention can be applied include, but are not limited to semiconductor devices. Semiconductor devices can include processors, memory devices, application specific integrated circuits (ASICs), logic circuits or devices, combinations of these and any other circuit device. In such devices, one or more semiconductor devices can be included in a central processing unit, a graphics processing unit, and/or a separate processor- or computing element-based controller (e.g., logic gates, etc.). The semiconductor devices can include one or more on-board memories (e.g., caches, dedicated memory arrays, read only memory, etc.). In some embodiments, the semiconductor devices can include one or more memories that can be on or off board or that can be dedicated for use by a hardware processor subsystem (e.g., ROM, RAM, basic input/output system (BIOS), etc.).

In some embodiments, the semiconductor devices can include and execute one or more software elements. The one or more software elements can include an operating system and/or one or more applications and/or specific code to achieve a specified result. In still other embodiments, the semiconductor devices can include dedicated, specialized circuitry that perform one or more electronic processing functions to achieve a specified result. Such circuitry can include one or more field programmable gate arrays (FPGAs), and/or programmable applications programmable logic arrays (PLAs).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, methods for manufacturing a magnetoresistive random access memory (MRAM) cell is shown in accordance with embodiments of the present invention. The MRAM cell includes a substrate 100 having multiple layers on which the MRAM cell will be fabricated. The substrate 100 can include any suitable substrate structure, e.g., a bulk semiconductor, a semiconductor-on-insulator (SOI) substrate, etc. In one example, the substrate 100 can include a silicon-containing material. Illustrative examples of Si-containing materials suitable for the substrate 100 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

While the substrate 100 can include a single semiconductor layer, the substrate 100 can also be comprised of a plurality of different layers including one or more front end of line (FEOL) layers, one or more middle of the line layers (MOL) and/or one more back end of line (BEOL) layers. These layers may include turn include one or more active device layers, one or more dielectric layers, one or more metal layers, etc.

A dielectric layer 102, such as, e.g., an interlevel dielectric layer (ILD) is formed on the substrate 100. The dielectric layer 102 can include any suitable material, e.g., selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The dielectric layer 102 can be deposited using chemical vapor deposition (CVD), although other deposition methods can be employed.

The deposited dielectric layer 102 is then patterned and etched to form a hole or trench. The trench is then lined with a diffusion barrier or metal liner 104. The diffusion barrier 104 can be conformally deposited over the topography of the dielectric layer 102. The diffusion barrier 104 can be deposited by an atomic layer deposition (ALD) process, physical vapor deposition (PVD) or a CVD process, although other processes may be employed. The diffusion barrier 104 can include a material such as, e.g., TiN, TaN, TiWN, TaWN, HfN or the like.

A conductive fill is performed to fill the trenches on top of the diffusion barrier 104. The conductive fill can include materials, such as, e.g., Cu, Ru, Mo, Rh, W, Ir, and alloys or combinations of these and other conductive materials. In a particularly useful embodiment, the conductive fill includes Ru. The conductive fill can be formed using a deposition method, such as, e.g., CVD, plasma enhanced CVD (PECVD), ALD or any other suitable deposition method.

A planarization process is performed, e.g., a chemical mechanical polish (CMP) to reduce the conductive fill to a surface of the dielectric layer 102 to form conductor 106. This CMP process also removes the diffusion barrier 104 from the surface of the dielectric layer 102. The conductor 106 can include a metal line, a via or any other suitable conductive structure. The conductor 106 form an electrode for the MRAM cell to be fabricated.

A dielectric cap layer 108 is deposited over the conductor 106 and dielectric layer 102. The dielectric cap layer 108 preferably includes a material that is selectively removeable relative to the dielectric layer 102, While the same materials and process used for the dielectric layer 102 can be employed for dielectric cap layer 108, dielectric cap layer 108 includes a different chemistry to enable the selectivity. For example, if dielectric layer 102 includes a silicon oxide, dielectric cap layer 108 can include a silicon nitride to be selectively etchable with respect to dielectric layer 102. The dielectric cap layer 108 includes a reduced thickness relative to the dielectric layer 102. For example, dielectric cap layer 108 is thick enough to protect the top portion of the conductor 106 during subsequent processing.

Figure 2:
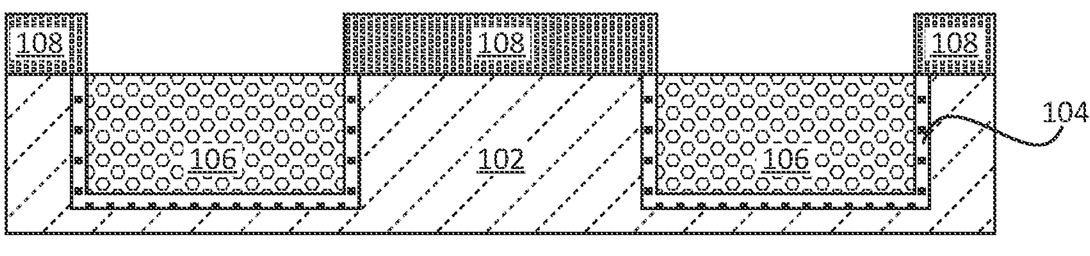
FIG. 2 is a cross-sectional view showing the cap dielectric layer patterned to reveal underlying conductors in accordance with an embodiment of the present invention.

Referring to FIG. 2, the dielectric cap layer 108 is patterned to open up the dielectric layer 108 to expose the conductor 106. The dielectric cap layer 108 can be patterned using lithographic patterning techniques to pattern an etch mask followed by an etching process, such as a reactive ion etch (RIE) or ion beam etch (IBE). The etch process can be selective to the materials of the conductor 106 and the diffusion barrier 104.

Figure 3:
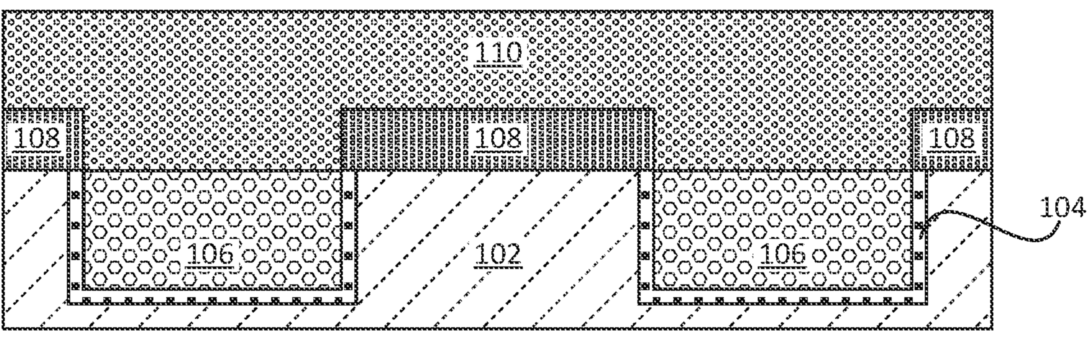
FIG. 3 is a cross-sectional view showing a cap conductor formed through the cap dielectric layer in accordance with an embodiment of the present invention.

Referring to FIG. 3, a conductive deposition 110 is performed to further fill the over the conductors 106. The conductive deposition 110 can include materials, such as, e.g., TaN, TaWN and alloys or combinations of these and other conductive materials. In a particularly useful embodiment, the conductive deposition 110 includes TaN. The conductive deposition 110 can be formed using a deposition method, such as, e.g., CVD, PECVD, ALD, PVD or any other suitable conformal deposition method.

Figure 4:
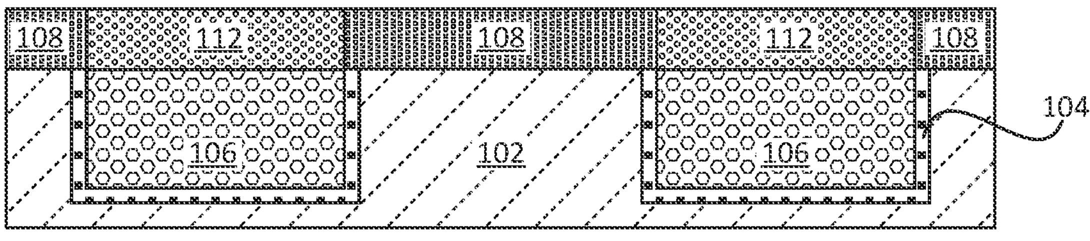
FIG. 4 is a cross-sectional view showing caps formed on the conductors in accordance with an embodiment of the present invention.

Referring to FIG. 4, a planarization process is performed, e.g., chemical mechanical polishing (CMP), to reduce the conductive deposition 110 to form a cap 112 in the recess over the conductors 106. The cap 112 will provide a conductive path between the conductors 106 and a bottom electrode (BE) to be formed.

Referring to FIG. 5, a conductive material 114 can be formed by a deposition process such as, for example, sputtering, CVD, or PECVD. The conductive material 114 can include Ta, TaN, Ti, TiN, Ru, RuN, RuTa, RuTaN, Co, CoWP, CON, W, WN and alloys or combinations of these and other conductive materials. The conductive material 114 makes electrical contact with the caps 112.

Referring to FIG. 6, in one embodiment, a hard mask 116 includes a hard mask material that may be formed by blanket depositing a layer of the hard mask material, providing a patterned photoresist on top of the layer of hard mask material, and then etching the layer of hard mask material to provide the hard mask 116, which protects a portion of the conductive material 114, e.g., to form the bottom electrode.

A patterned photoresist can be produced by applying a blanket photoresist layer to the surface of the hard mask material and exposing the photoresist layer to a pattern of radiation, and then developing the pattern into the photoresist layer utilizing resist developer. The hard mask 116 is patterned to a dimension that is narrower than the cap 112, but centered on the cap 112 to ensure a recessed bottom electrode from adjacent pillars in subsequent steps.

Etching of the exposed portion in accordance with the hard mask 116 may include an etch chemistry for removing the conductive material 114 with a high selectivity relative to the hard mask 116. In one embodiment, the etch process may be an anisotropic etch process, such as RIE or IBE.

Referring to FIG. 7, a bottom electrode 118 is etched into the conductive material 114 in accordance with the hard mask 116. The bottom electrode 118 includes a material that is selectively etchable relative to the cap 112 and dielectric cap layer 108.

Referring to FIG. 8, the hard mask 116 is removed. This can be completed using an etch selective to the bottom electrode 118, cap 112 and the dielectric cap layer 108. In another embodiment, the hard mask 116 can be removed using a planarization process, such as, e.g., CMP.

Figures 9, 10, 11, 12:
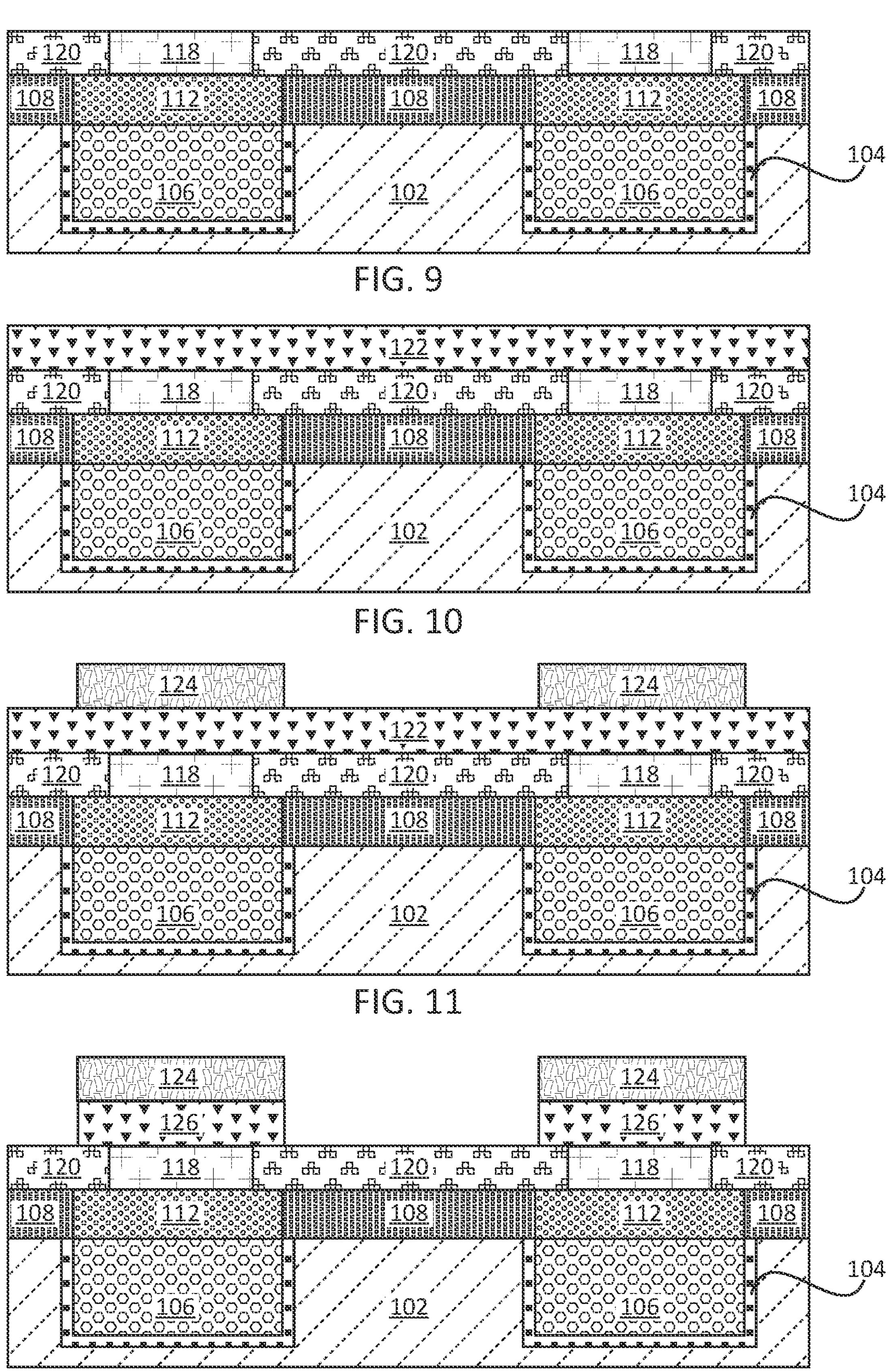
FIG. 9 is a cross-sectional view showing a dielectric layer formed in a first stage with a low aspect ratio in accordance with an embodiment of the present invention.
FIG. 10 is a cross-sectional view showing a ferromagnetic material deposited to form a reference layer in accordance with an embodiment of the present invention.
FIG. 11 is a cross-sectional view showing a hard mask formed to pattern the reference layer in accordance with an embodiment of the present invention.
FIG. 12 is a cross-sectional view showing the reference layer etched in accordance with an embodiment of the present invention.

Referring to FIG. 9, a dielectric layer 120, such as, e.g., an interlevel dielectric layer (ILD) is formed on the bottom electrode 118, portions of the cap 112 and the dielectric cap layer 108. The dielectric layer 120 can include any suitable material, e.g., selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SILK™, other carbon containing materials, organo-inorganic materials such as spin-on glasses and silsesquioxane-based materials, and diamond-like carbon (DLC), also known as amorphous hydrogenated carbon, α-C:H). The dielectric layer 120 can be deposited using CVD, plasma enhanced CVD (PECVD), spin-on deposition, although other deposition methods can be employed.

Referring to FIG. 10, the dielectric layer 120 can be planarized to bring the thickness down to that of the bottom electrode 118. A planarization process, such as, e.g., CMP can be employed. The dielectric layer 120 fills a low aspect region that includes the height of the bottom electrode 118. In this way, there is little or no chance of voids forming, which is more likely with a thicker deposition, and a first stage of applying an ILD is provided. Since the deposition is shallow (e.g., low aspect ratio), there is no gapfill concern between later formed device pillar structures.

Referring to FIG. 10, a ferromagnetic layer 122 is deposited. The ferromagnetic layer 122 can include, for example, a composition including cobalt (Co), iron (Fe), nickel (Ni), boron (B), or any combination thereof. In one example, the ferromagnetic layer 122 includes a reference layer (RL) with a fixed magnetization that can be formed of, e.g., CoFeB or CoFe. The ferromagnetic layer 122 can be formed by a deposition process such as, for example, PVD, CVD or PECVD.

Referring to FIG. 11, in one embodiment, a hard mask 124 is formed and includes a hard mask material that may be formed by blanket depositing a layer of the hard mask material, providing a patterned photoresist on top of the layer of hard mask material, and then etching the layer of hard mask material to provide the hard mask 124, which protects a portion of the ferromagnetic layer 122 relative to the bottom electrode 118. The hard mask 124 is patterned to a dimension that is wider than the bottom electrode 118, but centered on the bottom electrode 118 to ensure a recessed bottom electrode from adjacent pillars in subsequent steps.

Referring to FIG. 12, the hard mask 124 is used to etch the exposed portion of the ferromagnetic layer 122 in accordance with the hard mask 124 pattern to form a reference layer 126 for a magnetic tunnel junction (MTJ). The etch may include an etch chemistry for removing the ferromagnetic layer 122 with a high selectivity relative to the hard mask 124. The ferromagnetic layer 122 is removed down to the dielectric layer 120. In one embodiment, the etch process may be an anisotropic etch process, such as RIE or IBE.

Figures 13, 14, 15, 16:
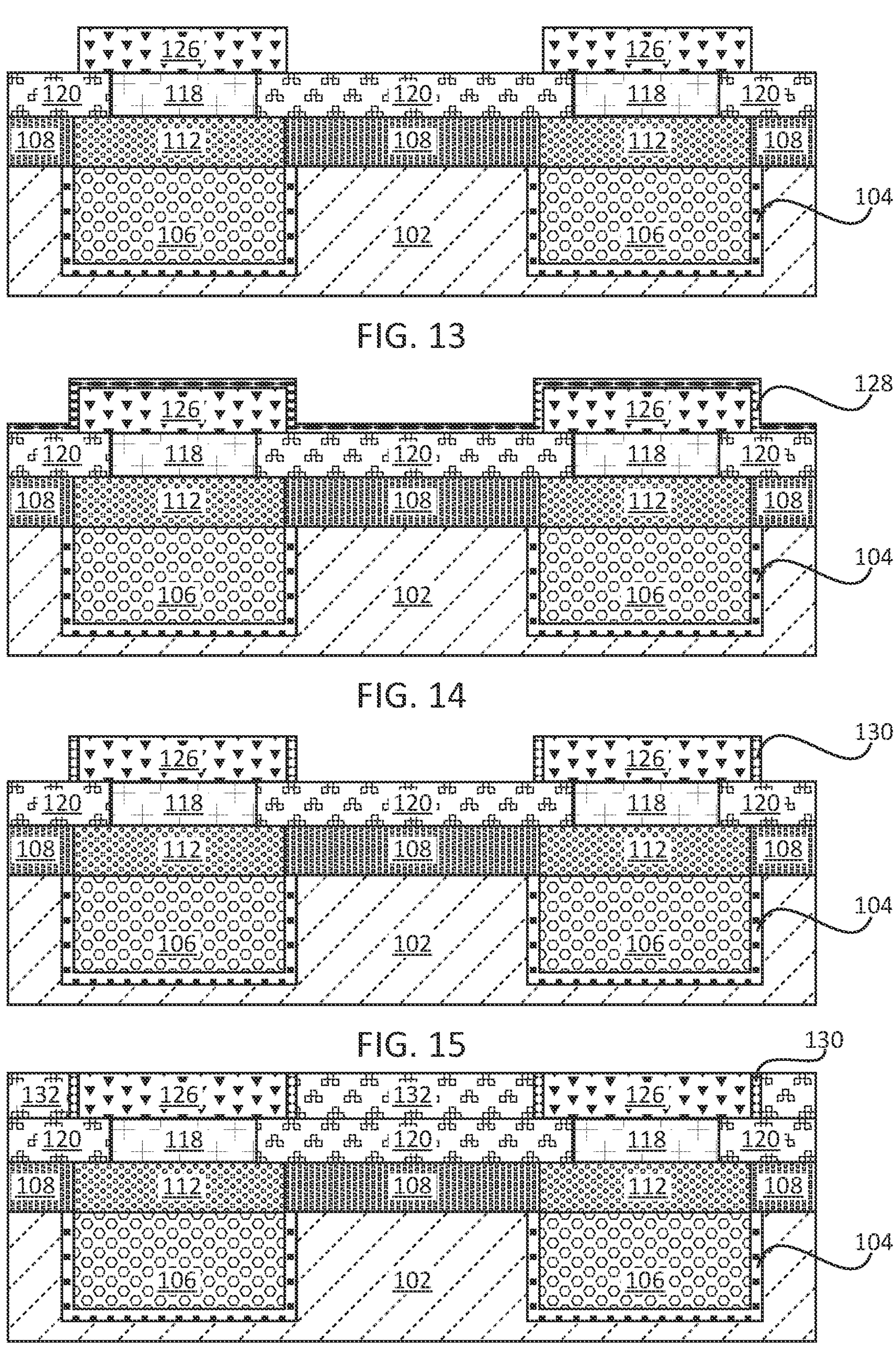
FIG. 13 is a cross-sectional view showing the hard mask removed in accordance with an embodiment of the present invention.
FIG. 14 is a cross-sectional view showing an encapsulation dielectric layer formed over the reference layer in accordance with an embodiment of the present invention.
FIG. 15 is a cross-sectional view showing an etch-back to form dielectric sidewalls on sides of the reference layer in accordance with an embodiment of the present invention.
FIG. 16 is a cross-sectional view showing a dielectric layer formed in a second stage with a low aspect ratio in accordance with an embodiment of the present invention.

Referring to FIG. 13, the hard mask 124 is removed. This can be completed using an etch selective to the dielectric layer 120. In another embodiment, the hard mask 124 can be removed using a planarization process, such as, e.g., CMP.

Referring to FIG. 14, a dielectric encapsulation layer 128 is formed over the reference layer 126 and dielectric layer 120. The dielectric encapsulation layer 128 will be employed to form sidewall spacers in contact with the sidewalls of the reference layer 126. The dielectric encapsulation layer 128 can be formed by depositing a conformal layer of dielectric material, such as oxides, nitrides or oxynitrides. In particularly useful embodiments, the dielectric encapsulation layer 128 can include SiN, SiNC or other suitable materials. The dielectric encapsulation layer 128 can be deposited using, e.g., a CVD method.

Referring to FIG. 15, an etch-back process is performed to remove the dielectric encapsulation layer 128 from the dielectric layer 120 and a top of the reference layer 126 except for the sidewalls of the reference layer 126 to form sidewall spacers 130.

Referring to FIG. 16, a dielectric layer 132 is deposited and planarized to bring the thickness down to that of the reference layer 126. The dielectric layer 132 can be formed and planarized in a same manner as dielectric layer 120. The dielectric layer 132 fills a low aspect region that includes the height of the reference layer 126. In this way, there is little or no chance of voids forming, which is more likely with a thicker deposition. A next stage of applying an ILD is provided. Since the deposition is shallow (e.g., low aspect ratio), there is no gapfill concern between later formed device pillar structures.

Figures 17, 18, 19, 20:
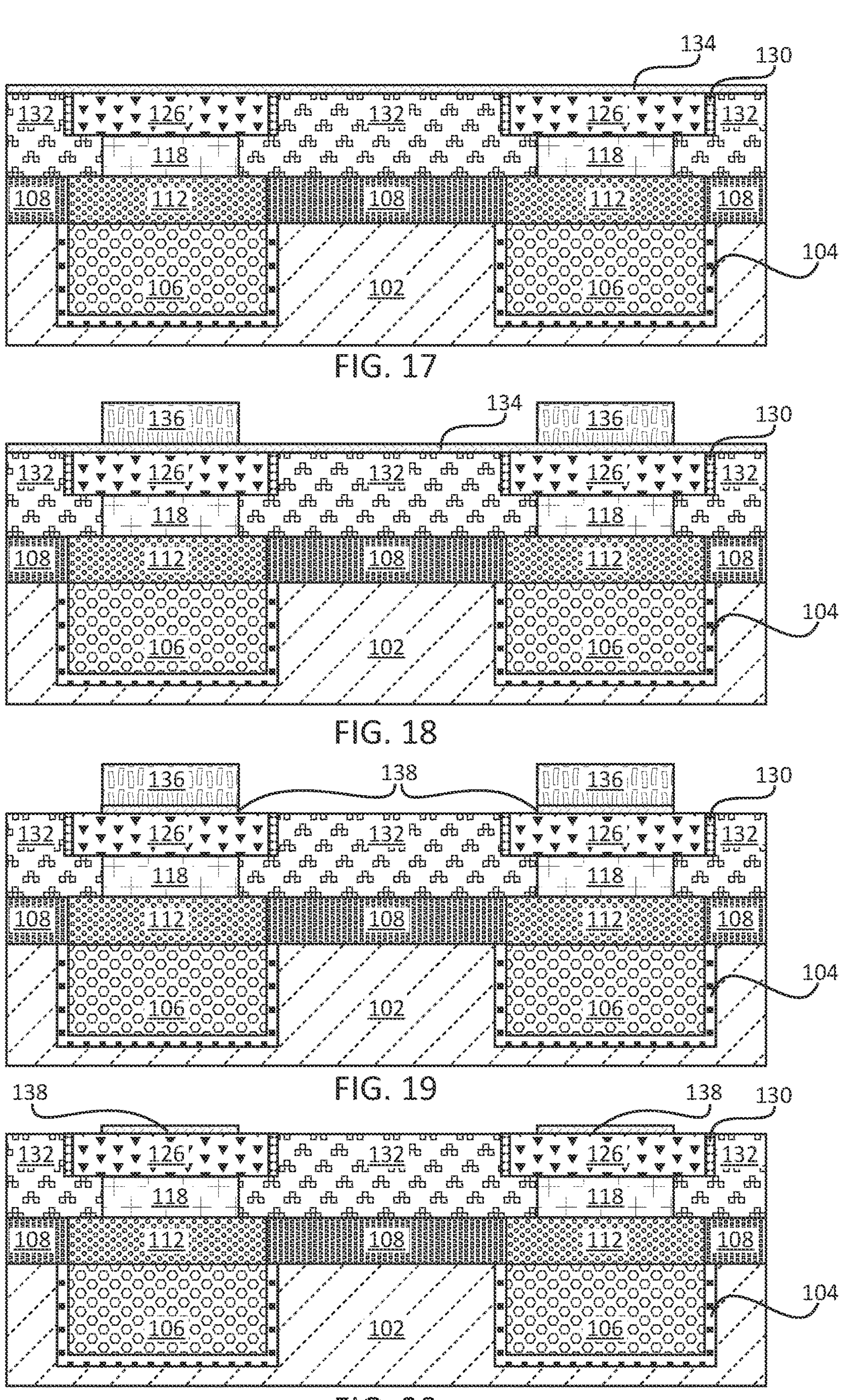
FIG. 17 is a cross-sectional view showing a tunnel barrier dielectric layer formed in accordance with an embodiment of the present invention.
FIG. 18 is a cross-sectional view showing a hard mask formed to pattern tunnel barrier dielectric layer in accordance with an embodiment of the present invention.
FIG. 19 is a cross-sectional view showing the tunnel barrier dielectric layer etched to conform to the bottom electrode footprint in accordance with an embodiment of the present invention.
FIG. 20 is a cross-sectional view showing the hard mask removed in accordance with an embodiment of the present invention.

Referring to FIG. 17, a tunnel barrier dielectric layer 134 is formed on the dielectric layer 132 and the reference layer 126. The tunnel barrier dielectric layer 134 is the site of tunnel magnetoresistance (TMR), which is the magnetoresistive effect that occurs in the MTJ structure. The tunnel barrier dielectric layer 134 can be formed of a non-magnetic, insulating material such as magnesium oxide (MgO), aluminum oxide ($Al_2O_3$), tantalum oxide ($Ta_2O_5$) or titanium oxide ($TiO_2$) or any other suitable materials. The tunnel barrier dielectric layer 134 may have a thickness ranging from about 0.5 nm to about 10 nm. The tunnel barrier dielectric layer 134 can be formed by a deposition process such as, for example, PVD, CVD or ALD.

Referring to FIG. 18, in one embodiment, a hard mask 136 is formed and includes a hard mask material that may be formed by blanket depositing a layer of the hard mask material, providing a patterned photoresist on top of the layer of hard mask material, and then etching the layer of hard mask material to provide the hard mask 136, which protects a portion of the tunnel barrier dielectric layer 134 relative to the reference layer 126. The hard mask 136 is patterned to a dimension that is narrower than the reference layer 126, but centered on the reference layer 126 to ensure a recessed tunnel barrier dielectric layer 134 from adjacent pillars in subsequent steps.

Referring to FIG. 19, the hard mask 136 is used to etch the exposed portion of the reference layer 126 in accordance with the hard mask 124 pattern to form a tunnel barrier (TB) 138 for a magnetic tunnel junction (MTJ). The etch may include an etch chemistry for removing the tunnel barrier dielectric layer 134 with a high selectivity relative to the hard mask 136. The tunnel barrier dielectric layer 134 is removed down to the dielectric layer 132. In one embodiment, the etch process may be an anisotropic etch process, such as RIE or IBE.

Referring to FIG. 20, the hard mask 136 is removed. This can be completed using an etch selective to the dielectric layer 132 and tunnel barrier 138. In another embodiment, the hard mask 136 can be removed using a planarization process, such as, e.g., CMP.

Figure 21:
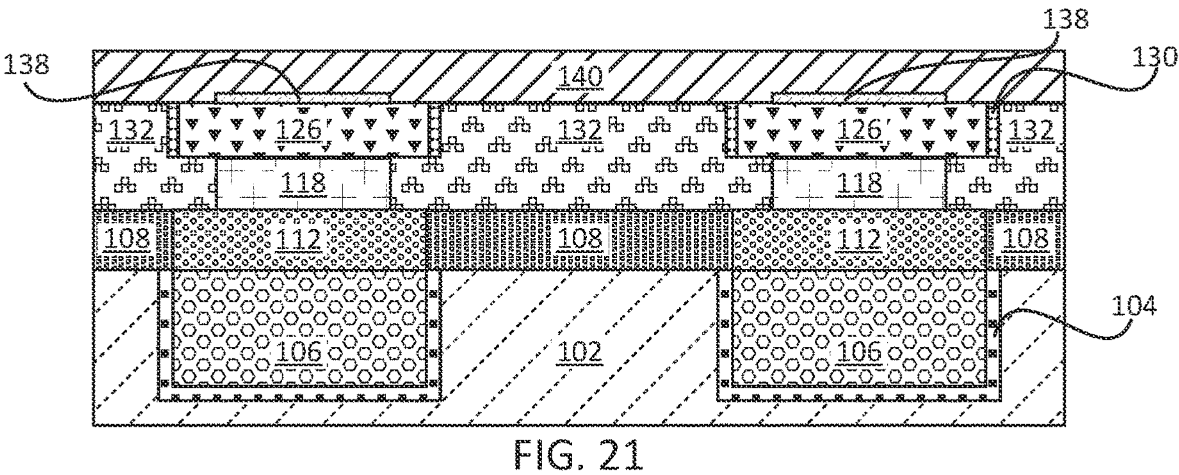
FIG. 21 is a cross-sectional view showing a dielectric layer for a dielectric ring formed in accordance with an embodiment of the present invention.

Referring to FIG. 21, a protective dielectric layer 140 is formed over the reference layer 126, the tunnel barrier 138 and dielectric layer 132. The protective dielectric layer 140 will be employed to form a dielectric ring around the tunnel barrier 138. The protective dielectric layer 140 can be formed by depositing a layer of dielectric material or materials, such as oxides, nitrides or oxynitrides. In particularly useful embodiments, the protective dielectric layer 140 can include SiN or other suitable materials. In another embodiment, the protective dielectric layer 140 includes $Al_2O_3$, $Ta_2O_5$ or other suitable materials. The protective dielectric layer 140 can be deposited using, e.g., a CVD method.

Figure 22:
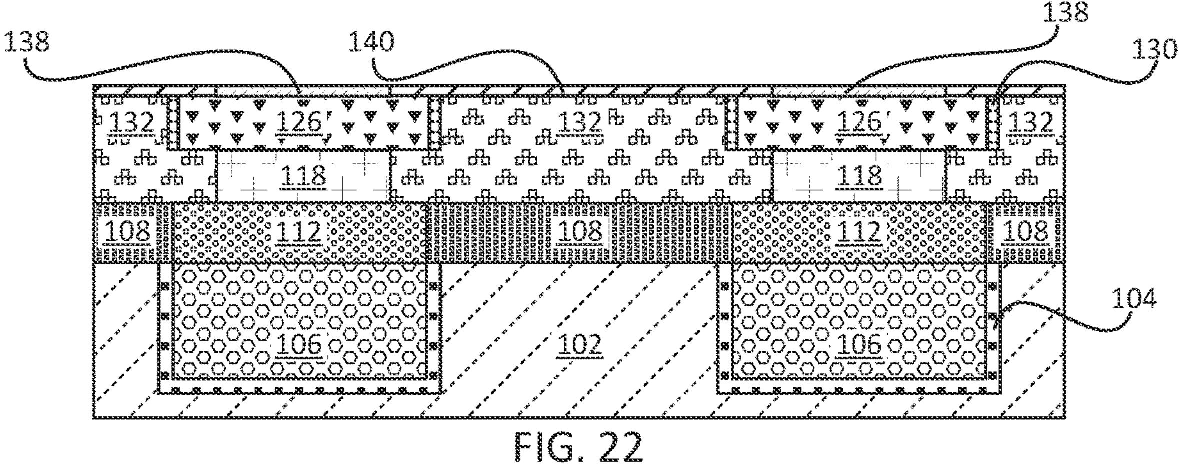
FIG. 22 is a cross-sectional view showing the dielectric layer for the dielectric ring planarized to a plane of and to a height of the tunnel barrier in accordance with an embodiment of the present invention.

Referring to FIG. 22, a planarization process, such as, e.g., CMP is performed to remove access material of the protective dielectric layer 140 down to the tunnel barrier 138.

Figure 23:
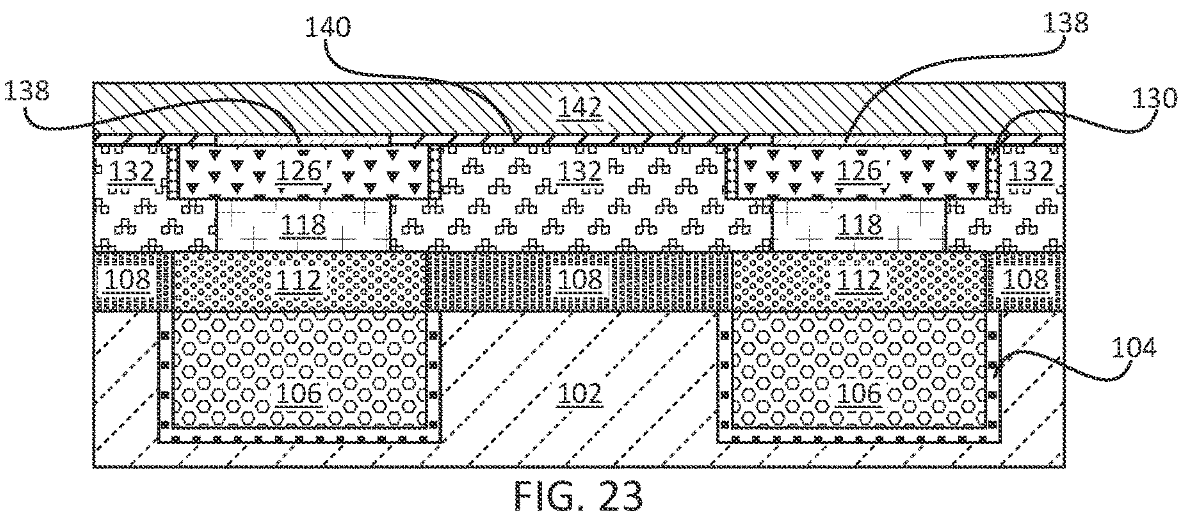
FIG. 23 is a cross-sectional view showing another ferromagnetic material deposited to form a free layer in accordance with an embodiment of the present invention.

Referring to FIG. 23, a ferromagnetic layer 142 is deposited. The ferromagnetic layer 142 can include, for example, a composition including cobalt (Co), iron (Fe), nickel (Ni), boron (B), or any combination thereof. In one example, the ferromagnetic layer 142 includes free magnetization layer (FL) and can be formed of, e.g., CoFeB or CoFe. The ferromagnetic layer 142 can be formed by a deposition process such as, for example, PVD, CVD or PECVD.

Figure 24:
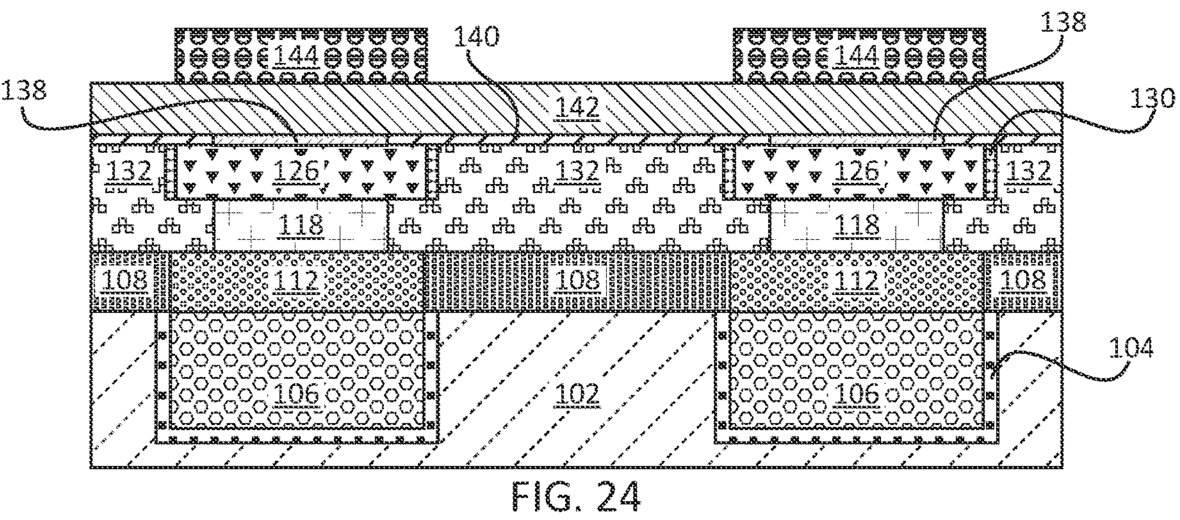
FIG. 24 is a cross-sectional view showing a hard mask formed to pattern the free layer in accordance with an embodiment of the present invention.

Referring to FIG. 24, in one embodiment, a hard mask 144 is formed and includes a hard mask material that may be formed by blanket depositing a layer of the hard mask material, providing a patterned photoresist on top of the layer of hard mask material, and then etching the layer of hard mask material to provide the hard mask 144, which protects a portion of the ferromagnetic layer 142 relative to the reference layer 126. The hard mask 144 is patterned to a dimension that corresponds with that of the reference layer 126, and is centered on the reference layer 126 to ensure alignment therewith. The tunnel barrier 138 is recessed relative to the end dimensions of the reference layer 126 and the free layer to be formed by etching in subsequent steps.

Figure 25:
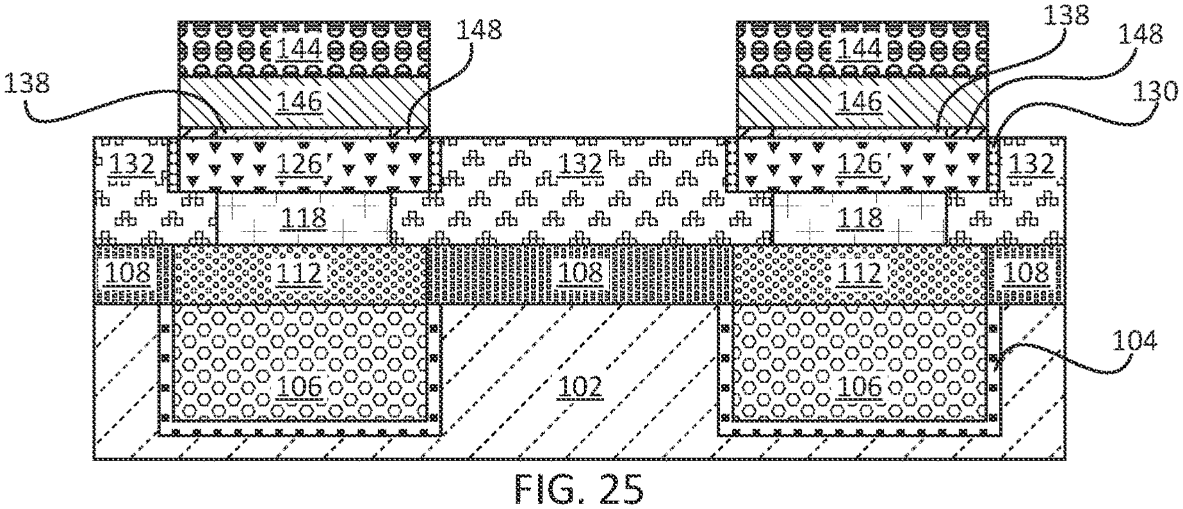
FIG. 25 is a cross-sectional view showing the free layer etched in accordance with an embodiment of the present invention.

Referring to FIG. 25, the hard mask 144 is used to etch the exposed portion of the ferromagnetic layer 142 (FIG. 23) in accordance with the hard mask 144 pattern to form a free layer (FL) 146 for a magnetic tunnel junction (MTJ). The etch may include an etch chemistry for removing the ferromagnetic layer 142 with a high selectivity relative to the hard mask 144. The ferromagnetic layer 142 is removed down to the protective dielectric layer 140 (FIG. 24). Then, etching continues to remove portions of the protective dielectric layer 140 down to dielectric layer 132. In one embodiment, the etch process may be an anisotropic etch process, such as RIE or IBE. The etching of the ferromagnetic layer 142 and the protective dielectric layer 140 can be done in a single etch process or in separate etch processes.

A dielectric ring or band 148 is formed that encircles the perimeter of the tunnel barrier 138. The dielectric ring 148 protects the tunnel barrier 138 during further processing of the reference layer 126 and the free layer 146 and during operation, to protect the tunnel barrier 138 from the possibility of contamination.

Figure 26:
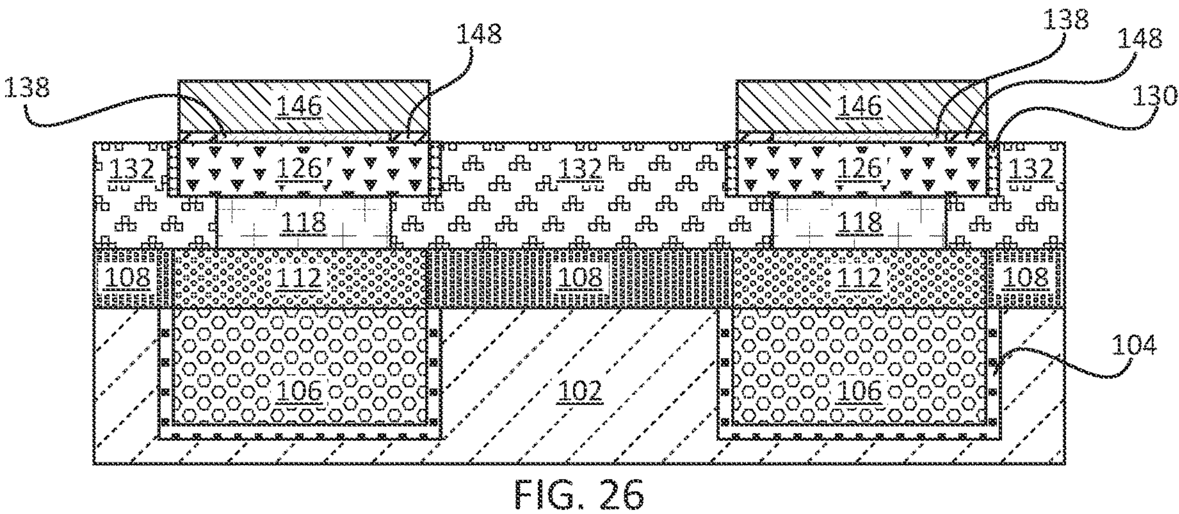
FIG. 26 is a cross-sectional view showing the hard mask removed in accordance with an embodiment of the present invention.

Referring to FIG. 26, the hard mask 144 is removed. This can be completed using a selective etch. In another embodiment, the hard mask 144 can be removed using a planarization process, such as, e.g., CMP.

Referring to FIG. 27, a dielectric encapsulation layer 150 is formed over the free layer 146 and dielectric layer 132 and contacts the dielectric ring 148. The dielectric encapsulation layer 150 will be employed to form sidewall spacers in contact with the sidewalls of the free layer 146. The dielectric encapsulation layer 150 can be formed by depositing a conformal layer of dielectric material or materials, such as oxides, nitrides or oxynitrides. In particularly useful embodiments, the dielectric encapsulation layer 150 can include SiN, SiNC or other suitable materials. The dielectric encapsulation layer 150 can be deposited using, e.g., a CVD method.

Referring to FIG. 28, an etch-back process is performed to remove the dielectric encapsulation layer 150 from all areas except for the sidewalls of the free layer 146 to form sidewall spacers 152. The sidewall spacers 152 and 130 completely cover the sidewalls of a MTJ 155. It show be noted that the sidewall spacers 152 and 130 can be comprised of the same or different materials. The sidewall spacers 152 and 130 preferably join at or intersect with the dielectric ring 148 to ensure proper dielectric isolation for the MTJ 155 and the tunnel barrier 138, in particular.

Referring to FIG. 29, a dielectric layer 154 is deposited and planarized to bring the thickness down to that of the free layer 146. The dielectric layer 154 can be formed and planarized in a same manner as dielectric layers 132 and 120. The dielectric layer 154 fills a low aspect region that includes the height of the free layer 146 and dielectric ring 148 (and tunnel barrier 138). In this way, there is little or no chance of voids forming, which is more likely with a thicker deposition. A next stage of applying an ILD is provided. Since the deposition is shallow (e.g., low aspect ratio), there is no gapfill concern between later formed device pillars.

Figures 30, 31, 32:
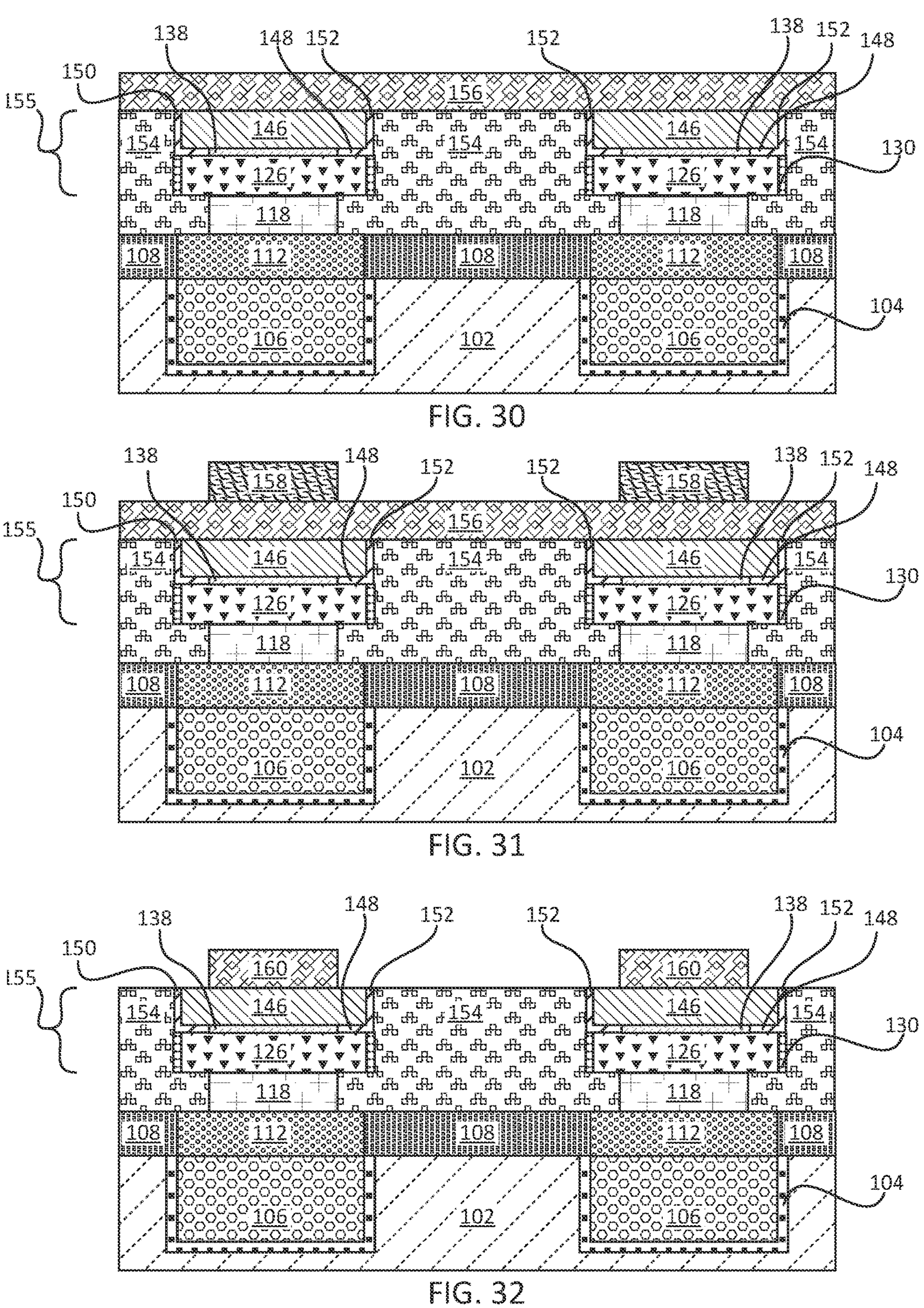
FIG. 30 is a cross-sectional view showing a conductive layer deposited to form a top electrode in accordance with an embodiment of the present invention.
FIG. 31 is a cross-sectional view showing a hard mask formed to pattern the top electrode and the top electrode etched to have a same footprint as the tunnel barrier and the bottom electrode in accordance with an embodiment of the present invention.
FIG. 32 is a cross-sectional view showing the hard mask removed in accordance with an embodiment of the present invention.

Referring to FIG. 30, a conductive material 156 can be formed by a deposition process such as, for example, sputtering, CVD, or PECVD. The conductive material 156 can include Ta, TaN, Ti, TiN, Ru, RuN, RuTa, RuTaN, Co, CoWP, CON, W, WN and alloys or combinations of these and other conductive materials. In one embodiment of the present application, conductive material 156 is composed of Ti/TiN. The conductive material 156 (that provides a top electrode) can be compositionally the same as, or compositionally different from, the conductive material that provides the bottom electrode 118 and can employ the same formation process.

Referring to FIG. 31, in one embodiment, a hard mask 158 includes a hard mask material that may be formed by blanket depositing a layer of the hard mask material, providing a patterned photoresist on top of the layer of hard mask material, and then etching the layer of hard mask material to provide the hard mask 158, which protects a portion of the conductive material 156, e.g., to form a top electrode. The hard mask 158 is patterned to a dimension that is narrower than the MTJ 155, but centered over the bottom electrode 118 to ensure a recessed top electrode from adjacent pillar structures in subsequent steps.

Etching of the exposed portion in accordance with the hard mask 158 may include an etch chemistry for removing the conductive material 156 with a high selectivity relative to the hard mask 158. In one embodiment, the etch process may be an anisotropic etch process, such as RIE or IBE.

Referring to FIG. 32, a top electrode 160 is etched into the conductive material 156 in accordance with the hard mask 158. The hard mask 158 is then removed. This can be completed using an etch selective to the top electrode 160, the free layer 146 and the dielectric layer 154. In another embodiment, the hard mask 158 can be removed using a planarization process, such as, e.g., CMP. The top electrode 160 is recessed back from the end portions of the MTJ 155. In one embodiment, the top electrode 160 and the bottom electrode share a same footprint, and the tunnel barrier 138 shares this footprint. A footprint includes a horizontal area occupied by a structure. A footprint can refer to the horizontal area at any vertical height, e.g., within a pillar.

Figure 33:
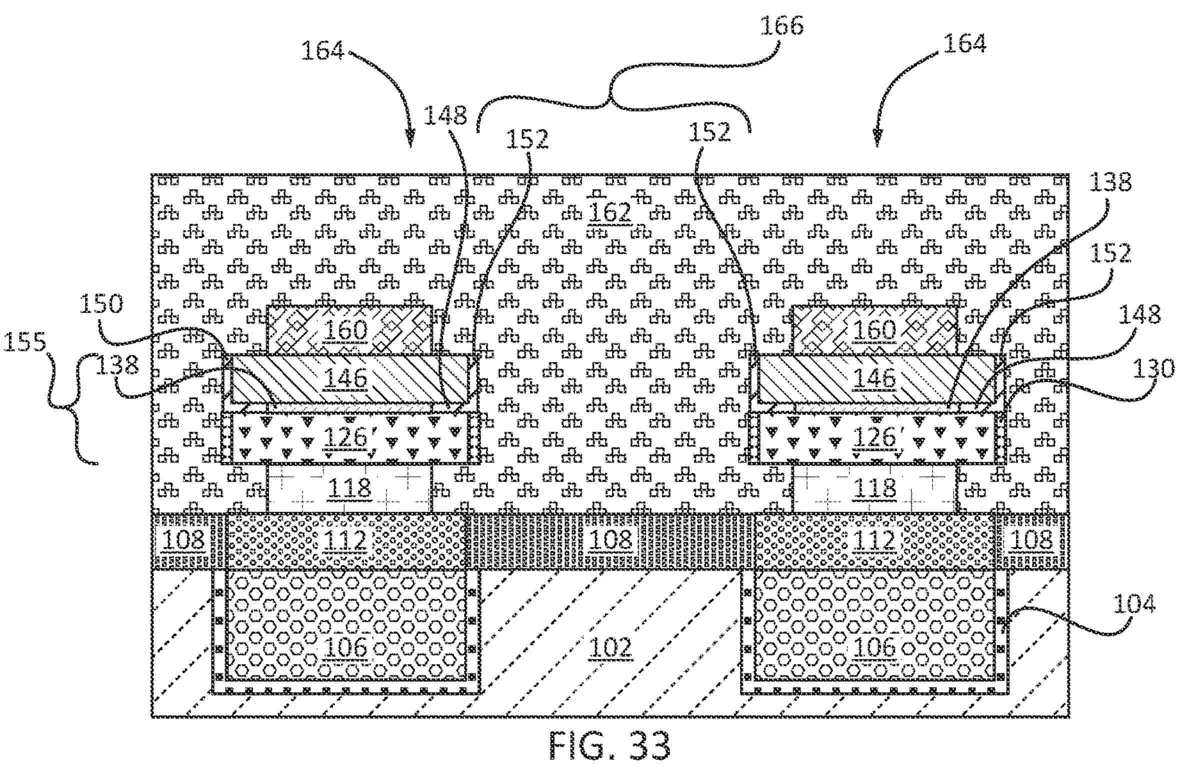
FIG. 33 is a cross-sectional view showing a dielectric layer formed in a fourth stage with a low aspect ratio in accordance with an embodiment of the present invention.

Referring to FIG. 33, a dielectric layer 162 is deposited. The dielectric layer 154 can be formed in a same manner as dielectric layers 154, 132 and 120. The dielectric layer 154 fills a low aspect region that includes the height of the top electrode 160 and provides sufficient thickness to form another conductor similar to conductor 106. The staged formation of dielectric layers 120, 132, 154 and 162 provides little or no chance of voids forming since only a small thickness of dielectric layer is formed at a time. Each of dielectric layers 120, 132, 154 and 162 provides a sublayer of the entire ILD that is separately deposited at a low aspect ratio to eliminate the possibility of voids. In this way, an entire ILD is provided free from voids between device pillar structures 164 in region 166. Since the deposition is shallow (e.g., low aspect ratio), there is no gapfill concern between the device pillar structures 164.

It should be noted that the sublayers (e.g., dielectric layers 120, 132, 154 and 162) can include a same or different dielectric materials. Since each sublayer is formed independently different materials can be selected for each sublayer.

Figure 34:
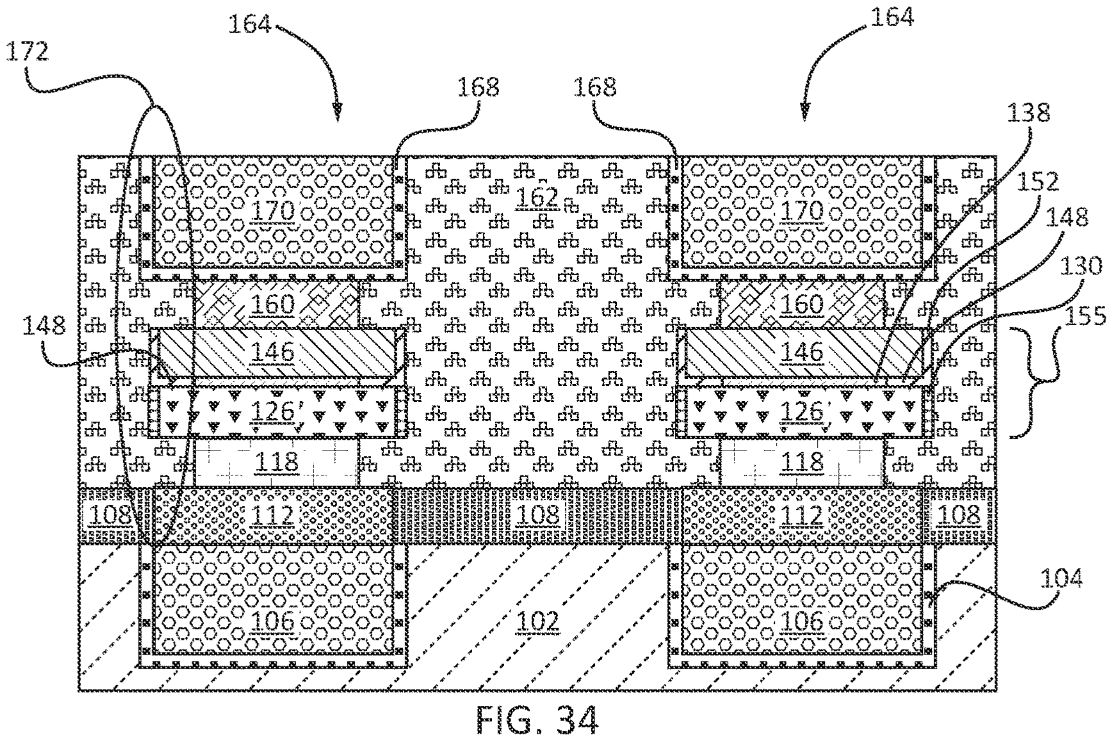
FIG. 34 is a cross-sectional view showing pillars with top conductors formed which contact the top electrodes, wherein the pillars include a disrupted sidewall geometry having the top and bottom electrodes recessed to within a periphery of the reference layer and the free layer in accordance with an embodiment of the present invention.

Referring to FIG. 34, the dielectric layer 162 is patterned and etched to form holes or trenches. The trenches may then be lined with a diffusion barrier or metal liner 168. The diffusion barrier 168 can be conformally deposited over the topography of the dielectric layer 162. The diffusion barrier 168 can be deposited by an ALD process or a CVD process, although other processes may be employed. The diffusion barrier 168 can include a material such as, e.g., TiN, TaN, TiWN, TaWN, HfN or the like.

A conductive fill is performed to fill the trench on top of the diffusion barrier 168. The conductive fill can include materials, such as, e.g., Cu, Ru, Mo, Rh, W, Ir, and alloys or combinations of these and other conductive materials. In a particularly useful embodiment, the conductive fill includes Ru. The conductive fill can be formed using a deposition method, such as, e.g., PVD, CVD, PECVD, ALD or any other suitable deposition method.

A planarization process is performed, e.g., CMP to reduce the conductive fill to a surface of the dielectric layer 162 to form conductors 170. This CMP process also removes the diffusion barrier 168 from the surface of the dielectric layer 162. The conductors 170 can include metal lines, vias or any other suitable conductive structure.

Device pillar structures 164 form memory storage portions of MRAM cells that can employ spin-transfer torque (STT) phenomenon realized in the MTJ 155, wherein the free layer 146 has a non-fixed magnetization, and the pinned or reference layer 126 has a fixed magnetization. The MTJ 155 stores information by switching the magnetization state of the free layer 146. A resistivity of the whole MTJ 155 changes when the magnetization of the free layer 146 changes direction relative to that of the fixed layer 126, exhibiting a low resistance state when the magnetization orientation of the two ferromagnetic layers is substantially parallel and a high resistance when they are anti-parallel. Therefore, the cells have two stable states that allow the cells to serve as non-volatile memory elements.

The device pillar structures 164 forming memory portions of MRAM cells are formed into arrays on a chip, which are connected by metal word and bit lines (e.g., conductors 106, 170). Each memory cell (associated with device pillar structures 164) is connected to a word line and a bit line (e.g., conductors 106 and 170). The word lines connect rows of cells, and bit lines connect columns of cells. A selection transistor (not shown) can be electrically connected to the MTJ 155 through the top electrode 160 or bottom electrode 118.

The device pillar structures 164 formed in accordance with embodiments of the present invention include a sidewall profile that is disrupted by a recessed bottom electrode 118 and a recessed top electrode 160. The recessed top and bottom electrodes increase an amount of dielectric material between the electrodes and make a short much less likely as a result of increased isolation. In addition, the staged formation of ILD layers makes a consistent and more uniform dielectric mass between pillar structures 164. Using a series of low aspect ratio depositions removes almost all concern for the formation of gaps or voids between pillar structures 164. Without gaps or voids, there is little possibility that conductive deposition of, e.g., the top electrode or metal conductors could fill the voids with conductive material. The problem of shorting between top portions of MTJ pillars is greatly reduced or eliminated.

In accordance with the embodiments of the present invention, the top electrode 160 and the bottom electrode 118 include a same footprint as and correspond to the tunnel barrier 138. The top electrode 160 and the bottom electrode 118 are recessed from an outer periphery of the free layer 146 and the reference layer 126. This forms a disrupted sidewall profile 172. The dielectric ring 148 provides isolation to the tunnel barrier 138 and extends to the periphery of the free layer 146 and the reference layer 126.

Having described preferred embodiments of devices and methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A magnetoresistive random access memory (MRAM), comprising:

a pillar structure having:

a bottom electrode;

a magnetic tunnel junction (MTJ) having a reference layer, a free layer and a tunnel barrier disposed between the reference layer and the free layer, the MTJ disposed on the bottom electrode; and a top electrode disposed on the MTJ;

wherein the bottom electrode and the top electrode are recessed within a periphery of the MTJ to form a disrupted sidewall profile, and wherein the top electrode, tunnel barrier and bottom electrode share a same footprint.

2. The MRAM as recited in claim 1, further comprising a dielectric ring disposed about a periphery of the tunnel barrier, the dielectric ring extending in a same plane as the tunnel barrier to a periphery of the reference layer and the free layer.

3. The MRAM as recited in claim 2, wherein the dielectric ring includes silicon nitride.

4. The MRAM as recited in claim 2, wherein the dielectric ring includes aluminum oxide.

5. The MRAM as recited in claim 2, wherein the dielectric ring includes tantalum oxide.

6. The MRAM as recited in claim 1, further comprising an interlevel dielectric layer adjacent to the pillar structure, the interlevel dielectric layer including at least three sublayers formed by separate processes.

7. The MRAM as recited in claim 6, wherein the at least three sublayers includes four sublayers.

8. The MRAM as recited in claim 6, wherein the at least three sublayers include at least two different materials.

9. A method for making a magnetoresistive random access memory (MRAM), comprising:

forming a bottom electrode having a first footprint;

forming a first sublayer of an interlevel dielectric layer corresponding to a level of the bottom electrode;

forming a first ferromagnetic layer on the bottom electrode having a second footprint that is larger than the first footprint;

forming a second sublayer of the interlevel dielectric layer corresponding to a level of the first ferromagnetic layer;

forming a tunnel barrier on the first ferromagnetic layer within the first footprint;

forming a dielectric ring in a plane of the tunnel barrier and extending between the first footprint and the second footprint;

forming a second ferromagnetic layer on the tunnel barrier and the dielectric ring, the second ferromagnetic layer having the second footprint;

forming a third sublayer of the interlevel dielectric layer corresponding to a level of the second ferromagnetic layer; and forming a top electrode having the first footprint.

10. The method as recited in claim 9, further comprising forming a fourth sublayer of the interlevel dielectric layer corresponding to a level of the top electrode.

11. The method as recited in claim 9, wherein forming the first ferromagnetic layer includes forming a first portion of a sidewall spacer on sidewalls of the first ferromagnetic layer.

12. The method as recited in claim 11, wherein forming the second ferromagnetic layer includes forming a second portion of a sidewall spacer on sidewalls of the second ferromagnetic layer.

13. The method as recited in claim 12, wherein the first portion of the sidewall spacer and the second portion of the sidewall spacer intersect at the dielectric ring.

14. The method as recited in claim 9, wherein the dielectric ring includes silicon nitride.

15. The method as recited in claim 9, wherein the dielectric ring includes aluminum oxide.

16. The method as recited in claim 9, wherein the dielectric ring includes tantalum oxide.

17. A method for making a magnetoresistive random access memory (MRAM), comprising:

forming a bottom electrode having a first footprint;

forming a first sublayer of an interlevel dielectric layer corresponding to a level of the bottom electrode;

forming a first ferromagnetic layer on the bottom electrode having a second footprint that is larger than the first footprint;

forming a first portion of a sidewall spacer on sidewalls of the first ferromagnetic layer;

forming a second sublayer of the interlevel dielectric layer corresponding to a level of the first ferromagnetic layer;

forming a tunnel barrier on the first ferromagnetic layer within the first footprint;

forming a dielectric ring in a plane of the tunnel barrier and extending between the first footprint and the second footprint;

forming a second ferromagnetic layer on the tunnel barrier and the dielectric ring, the second ferromagnetic layer having the second footprint;

forming a second portion of a sidewall spacer on sidewalls of the second ferromagnetic layer, wherein the first portion of the sidewall spacer and the second portion of the sidewall spacer intersect at the dielectric ring;

forming a third sublayer of the interlevel dielectric layer corresponding to a level of the second ferromagnetic layer;

forming a top electrode having the first footprint; and forming a fourth sublayer of the interlevel dielectric layer corresponding to a level of the top electrode.

18. The method as recited in claim 17, wherein the dielectric ring includes aluminum oxide.

19. The method as recited in claim 17, wherein the dielectric ring includes tantalum oxide.

* * * * *